(12) United States Patent
Nguyen et al.

(10) Patent No.: US 11,855,420 B1
(45) Date of Patent: *Dec. 26, 2023

(54) ALTERNATING CURRENT TIME-SHARING OUTLETS AND SWITCH BOX

(71) Applicants: Vincent Hung Nguyen, Anaheim, CA (US); Trang Lan Do, Anaheim, CA (US)

(72) Inventors: Vincent Hung Nguyen, Anaheim, CA (US); Trang Lan Do, Anaheim, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/645,384

(22) Filed: Dec. 21, 2021

Related U.S. Application Data

(63) Continuation-in-part of application No. 16/802,201, filed on Feb. 26, 2020, now Pat. No. 11,394,202.

(Continued)

(51) Int. Cl.

| | |
|---|---|
| *H02B 1/48* | (2006.01) |
| *H02J 7/00* | (2006.01) |
| *H02B 1/18* | (2006.01) |
| *H05K 5/00* | (2006.01) |
| *H02B 1/20* | (2006.01) |
| *G01R 21/00* | (2006.01) |
| *G06F 1/26* | (2006.01) |
| *H02J 3/14* | (2006.01) |
| *H01R 13/66* | (2006.01) |
| *G06F 13/42* | (2006.01) |
| *G06F 13/40* | (2006.01) |

(52) U.S. Cl.
CPC ............... *H02B 1/48* (2013.01); *G06F 1/266* (2013.01); *G06F 13/4022* (2013.01); *G06F 13/4282* (2013.01); *H01R 13/6691* (2013.01); *H02B 1/18* (2013.01); *H02B 1/20* (2013.01); *H02J 3/14* (2013.01); *H02J 7/0042* (2013.01); *H05K 5/0017* (2013.01); *G01R 21/00* (2013.01)

(58) Field of Classification Search
CPC ...... H01R 13/6691; H02J 3/14; H02J 7/0042; G06F 1/266; G06F 13/4022; G06F 13/4282; H02B 1/48; H02B 1/20; H05K 5/0017; G01R 21/00
USPC ........ 323/311; 361/106, 661, 642, 622, 625, 361/600; 439/488; 307/39, 38, 126, 131
See application file for complete search history.

(56) References Cited

U.S. PATENT DOCUMENTS

| | | | |
|---|---|---|---|
| 4,875,152 A | 10/1989 | Foster | |
| 10,372,192 B2 * | 8/2019 | Emby | .................... H01R 24/62 |

(Continued)

FOREIGN PATENT DOCUMENTS

| | | | | |
|---|---|---|---|---|
| GB | 2505930 A | * | 3/2014 | ........... H01R 25/006 |
| GB | 2505930 A | | 3/2014 | |

*Primary Examiner* — Arnold M Kinkead
(74) *Attorney, Agent, or Firm* — INNOVATION CAPITAL LAW GROUP, LLP; Vic Lin

(57) ABSTRACT

Methods and apparatus can be used to turn an existing 240 VAC or 480 VAC/600 VAC outlet into two or more time-sharing, i.e., one operating at a time, outlets. An AC switch box with two time-sharing outlets can be made with either a mechanical switch for switching which load receives power, or automatically, by a microcomputer system, for example. In the automatic AC switch box, the non-favored outlet may be typically powered on unless a load is detected at the favored/default outlet, when power to the non-favored outlet is automatically disconnected until the load is reduced or eliminated.

19 Claims, 9 Drawing Sheets

Related U.S. Application Data

(60) Provisional application No. 62/820,439, filed on Mar. 19, 2019.

(56) References Cited

U.S. PATENT DOCUMENTS

| | | | |
|---|---|---|---|
| 11,394,202 B1* | 7/2022 | Nguyen | H01R 13/6691 |
| 2009/0215319 A1 | 8/2009 | Gandhi | |
| 2016/0070324 A1* | 3/2016 | Emby | G06F 13/4022 |
| | | | 710/110 |

* cited by examiner

2-Pole, 3-Wire Grounding: 480V AC

4-Pole, 4-Wire Non-Grounding: 3Ø 277/480V

4-Pole, 4-Wire Non-Grounding: 3Ø 347/600V

4-Pole, 5-Wire Grounding: 3Ø 347/600V

ALTERNATING CURRENT TIME-SHARING OUTLETS AND SWITCH BOX

CROSS REFERENCE TO RELATED APPLICATIONS

This application is a continuation-in-part of U.S. patent application Ser. No. 16/802,201, filed Feb. 26, 2020, which claims the benefit of priority to U.S. Provisional Patent Application No. 62/820,439, filed Mar. 19, 2019, the contents of both of which are herein incorporated by reference.

BACKGROUND OF THE INVENTION

1. Field of the Invention

Embodiments of the invention relate generally to electrical power supplies. More particularly, embodiments of the invention relate to methods and apparatus for a time-shared outlet that can be connected to two distinct power loads and switched to provide power selectively to one of the two distinct power loads.

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

If a user has a high current capacity 240 volts alternating current (VAC) or a 480 VAC/600 VAC outlet but has two loads that could draw power from these sources, it is often expensive and time consuming to wire a new outlet. Simply providing an extension cord-like apparatus that splits the outlet into two risks drawing current over the rated maximum current through the wire, which could result in overheating and even fire.

As can be seen, there is a need for an economical way to time-share an existing high current capacity 240 VAC or a 480 VAC/600 VAC outlet that is unique in a location to run two different loads/appliances one at a time.

SUMMARY OF THE INVENTION

The typical 240/250 VAC and 480/600 VAC wirings in the USA are depicted in FIGS. 6 through 11. A two-pole, double throw (2PDT) switch can be used to physically move the two active wires L1, L2 of the 240/250 VAC wirings or the 480 VAC/600 VAC-1PHASE wirings from one source to two different locations/receptacles/outlets. It should be noted that a single-pole, double throw (1PDT/SPDT) switch can break the current flow to a 240 VAC or 480 VAC/600 VAC-1PHASE system but is not safe since either 120 VAC or 240 VAC/300 VAC is still present at one leg of the connector when the connector is supposed to be OFF.

An appropriate three-pole, double-throw (3PDT) switch can be used to physically move the three active wires PHASE-A, PHASE-B, PHASE-C of the 480 VAC/600 VAC-3PHASE wirings from one source to two different locations/receptacles/outlets.

The 3PDT switch can be used to safely switch the 240/250 VAC, 480 VAC/600 VAC-1PHASE, and 480 VAC/600 VAC-3PHASE active wires to two different locations/receptacles/outlets.

Similarly, an appropriate three-pole (3P) slide or rotary switch can be used to physically move the above-mentioned 240 VAC, 480 VAC/600 VAC-1Phase, and 480 VAC/600 VAC-3Phase active wires to more than two locations/receptacles/outlets.

The ground and neutral wires can be directly tied together at all receptacles/outlets.

The methods described above can be used to time-share as many outlets as the availability of the components (switches and receptacles) that meet the load requirements.

The same methods can also be used for any AC wiring in the world that has 2 or 3 active lines using the appropriate connector type(s) (3-, 4-, or 5-prong) to time share outlets. By providing such a switching mechanism, a user can be assured that only one load is powered at a time, thereby not exceeding the maximum rated current of the circuit.

These methods can be used to build a 240V/480V AC Switch Box with two receptacles/outlets and a 3PDT switch—rated at 30 A at 250 VAC—that can switch both 240 VAC and 480 VAC (limit set by component selection) and an optional AC meter to provide voltage, current, and power measurements. The existing outlet wiring can be connected to the 3PDT switch that will, upon the user's selection, move the active AC lines to the selected receptacle/outlet. The user can plug up to two loads in the two receptacles/outlets and select the active side using the switch to run two different loads/appliances from one wired outlet.

While the user can, alternately, unplug and swap the two loads to time-share the existing outlet, this may become tedious over time and may wear out the existing outlet leading to the need for expensive repairs.

Embodiments of the present invention provide an alternating current (AC) switch device comprising a cord and plug configured to electrically connect to an existing outlet; a housing containing a first receptacle and a second receptacle; and a switch configured to deliver power from the cord and plug to at least one of the first receptacle and the second receptacle.

Embodiments of the present invention further provide an alternating current (AC) switch device comprising a cord and plug configured to electrically connect to an existing outlet; a housing containing a first receptacle and a second receptacle; and a manually activated switch configured to deliver power from the cord and plug to one of the first receptacle and the second receptacle, wherein the housing has a length and width of less than seven inches and a depth of less than 2.5 inches; and the first receptacle and the second receptacle are configured for at least 240 volts AC.

Embodiments of the present invention also provide an automatic alternating current (AC) switch device comprising a cord and plug configured to electrically connect to an existing outlet; a housing containing a first receptacle and a second receptacle, the first receptacle and the second receptacle receiving power from the cord and plug; and a microcomputer-controlled electronic switch configured to disconnect power from being delivered to the second receptacle when the first receptacle is above a predetermined maximum amperage, wherein the first receptacle and the second receptacle are configured for at least 240 volts AC.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Figure 1:
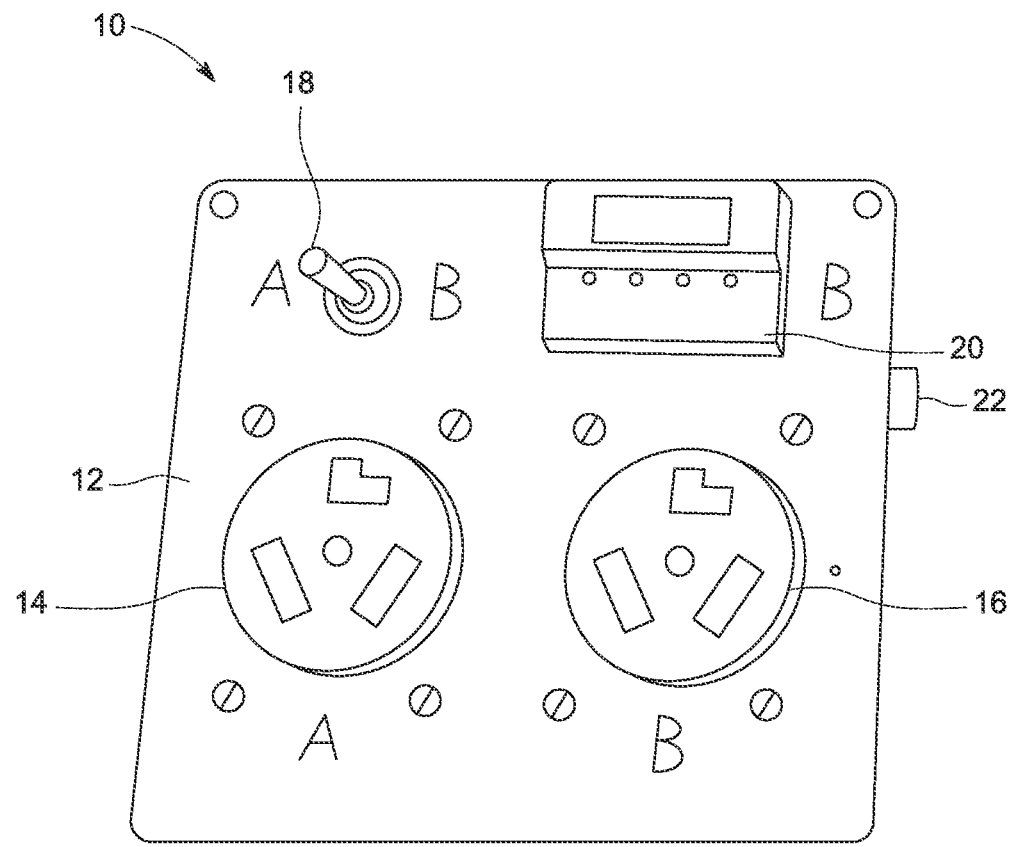
FIG. 1 illustrates a front view of a power switch box according to an exemplary embodiment of the present invention.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention and is not intended to limit the invention to the specific embodiments illustrated by the figures or description below.

As is well known to those skilled in the art, many careful considerations and compromises typically must be made when designing for the optimal configuration of a commercial implementation of any system, and in particular, the embodiments of the present invention. A commercial implementation in accordance with the spirit and teachings of the present invention may be configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

Broadly, embodiments of the present invention provide methods and apparatus to turn an existing 240 VAC or 480 VAC/600 VAC outlet into two or more time-sharing, i.e., one operating at a time, outlets. An AC switch box with two time-sharing outlets can be made with either a mechanical switch for switching which load receives power, or automatically by, for example, a microcomputer system. In the automatic AC switch box, the non-favored outlet may be typically powered on unless a load is detected at the favored/default outlet, when power to the non-favored outlet is automatically disconnected until the load is reduced or eliminated. In some embodiments, each outlet may be configured for 240V, 30 A service, thus providing a maximum of 7200 watts at each outlet.

In some embodiments, the apparatus can include a temperature monitor. The temperature monitor may send a temperature signal for display and may also be used to shut down power to one or both receptacles, typically to the second receptacle that may power an electronic vehicle, for example. In some embodiments, the apparatus may automatically resume operation after an over temperature shutdown, after a predetermined period of time. In other embodiments, a manual reset may be required, assuring the user is aware of the over temperature shutdown.

In some embodiments, the apparatus can include a current sensor on one or both of the outlets. The current sensor can shut down an outlet if a current reading is at or beyond a predetermined maximum. For example, a 30 A outlet may shutdown at 90 percent current draw, or once more than 27 A is drawn at the outlet. In some embodiments, the apparatus may automatically resume operation after an overcurrent shutdown, after a predetermined period of time. In other embodiments, a manual reset may be required, assuring the user is aware of the overcurrent shutdown.

Figure 1A:
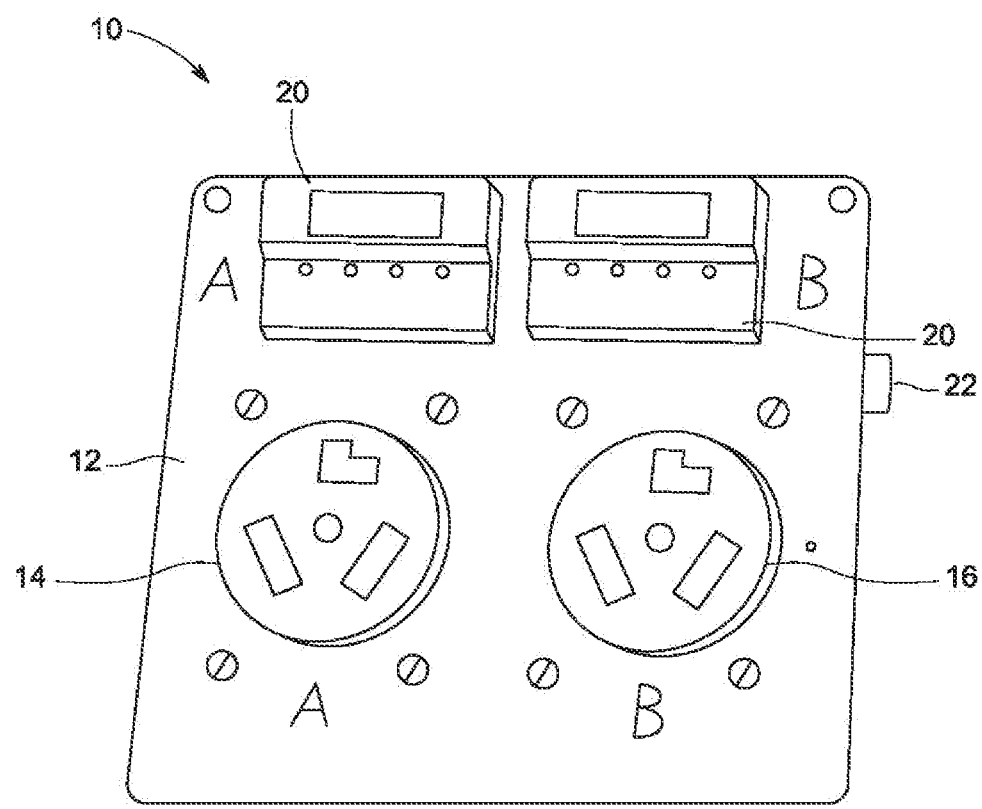
FIG. 1A illustrates a front view of a power switch box having two meters, according to an exemplary embodiment of the present invention.
Figure 2:
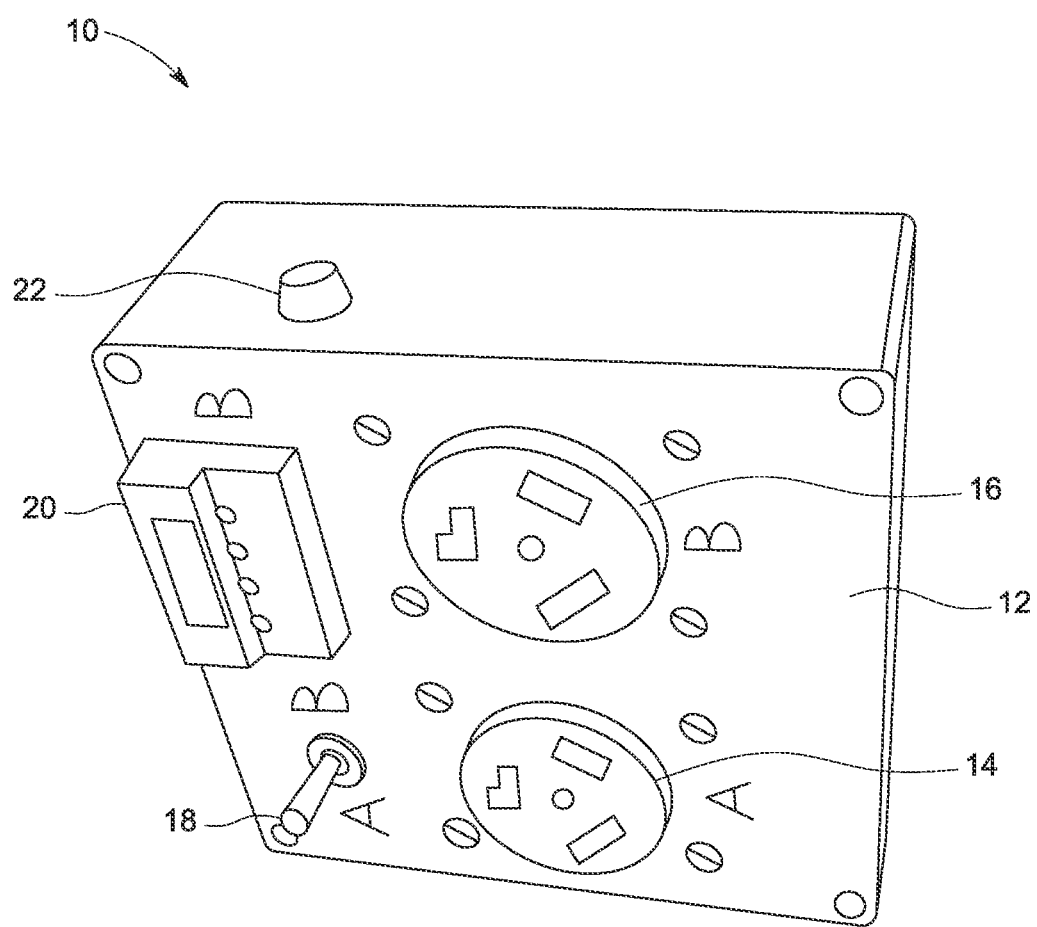
FIG. 2 illustrates a side perspective view of the power switch box of FIG. 1.
Figure 3:
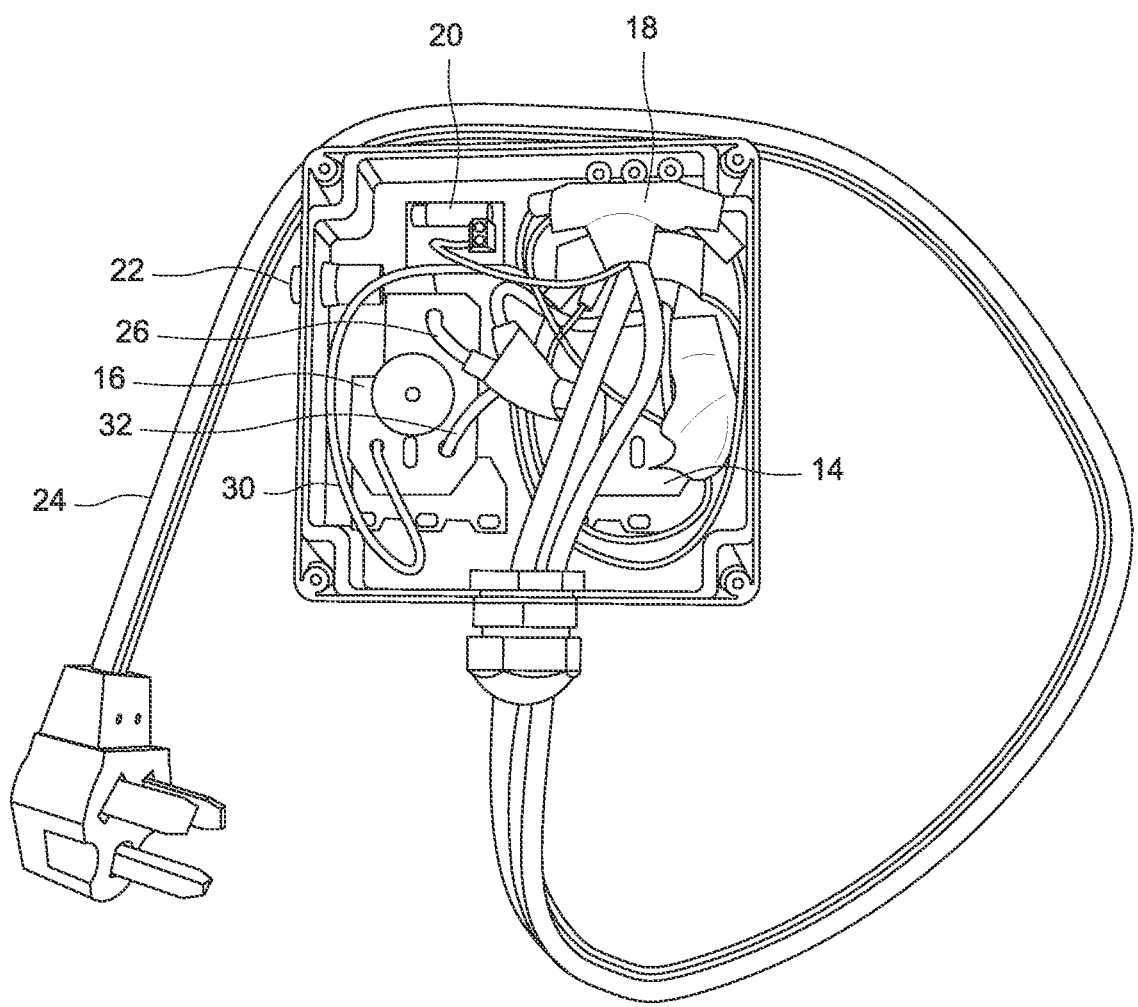
FIG. 3 illustrates a back view of the power switch box with a back side of its housing removed.

Referring now to FIGS. 1 through 3, a manual AC switch system 10, also simply referred to as a switch box 10, can include an outer housing 12 with a first receptacle 14 and a second receptacle 16 accessible through openings in the housing 12. A manual switch 18, or simply switch 18, may be disposed outside the housing 12 to permit a user to choose between the first and second receptacles 14, 16. A reset button 22 may be accessible from outside the housing, where the reset button 22 may be used to bring the microcomputer to a known start-up state in the event of illogical or fault conditions. For example, both LEDs indicating power to each receptacle are on or flashing, or the like. Finally, the switch box can include a meter 20 for providing a reading of the voltage, current, temperature or the like, of the selected receptacle. In some embodiments, a meter 20 may be provided for each receptacle, as shown in FIG. 1A. A power cord 24 can provide an electrical connection between an existing power outlet (not shown) and the switch box 10. In some embodiments, the switch box 10 may include blades extending from a back side thereof for a direct plug into the existing power outlet. The elements of the switch box 10 are discussed in greater detail below.

The AC switch system 10 can be housed in the housing 12 that is typically formed of plastic, such as ABS or polycarbonate. In one embodiment, the housing 12 may have a length and width between 5 and 10 inches, with a depth of 2 to 4 inches, typically, with a length and width of 6.30 inches and a depth of 2.37 inches.

The housing 12 can include two receptacles, the first receptacle 14 and the second receptacle 16, typically NEMA receptacles with either 3-, 4- or 5-prongs, with appropriate voltage and amperage ratings that are used for 240 VAC or 480 VAC connections. Some examples of receptacles 14, 16 include NEMA 10-30R (240 VAC, 30 A), 14-30R (240 VAC, 30 A) and L16-20R (480 VAC, 20 A). One receptacle 14 can be named side/port A and the other receptacle 16 can be named side/port B. The receptacles 14, 16 may be the same or different in configuration. Typically, the receptacles 14, 16 may be rated at the same current, however, in some embodiments, the receptacles 14, 16 may be rated at different currents, provided that none of the receptacles 14, 16 are rated greater than that of the existing receptacle from which the switch box 10 draws power.

The housing 12 can include one switch 18, such as a 3PDT switch that allows both 240 VAC and 480 VAC switching. Typically, the switch 18 will have a 30 A rating, but other switch ratings may be used depending on the particular application. One exemplary switch is the NKK S832 switch (30 A at 250 VAC). The switching is physical and is typically performed by a quality switch component so any change/variation in electrical DC characteristics is minimal. For example, at a 30 A resistive load, a drop of ~0.3V occurs due to ~0.01-ohm switch resistance. The AC frequency (50 or 60 Hz) and the phase of the AC signals would not change due to the switch.

The housing 12 can further include an optional AC panel meter 20. The meter 20 may be selected with various specifications, such as ±1% accuracy for current measurements, ±1% accuracy for voltage measurements and ±2% accuracy for power measurements.

The housing 12 can include a fuse box and fuse to protect the AC panel meter 20 and enhance the user's safety. The fuse box and fuse may be placed at one side of or inside the housing 12 for maximum user's safety. The fuse may be a slow-blow/time-delay type with ratings 0.5 A, 250 VAC.

Should a high current condition or short-circuit occur in the power section of the electronics, the fuse can instantly break the current to preclude damage and/or fire hazard.

In some embodiments, the housing 12 can include indicators, such as LED indicators to indicate that side A (the first receptacle 14) or side B (the second receptacle 16) is activated.

Inside the housing 12, the appropriate wiring may be used to support the current loads. For example, a 10 AWG copper wire may be used for a 30-amp load. The wiring may be solid wire or may be stranded wire. When stranded wire is used, a ferrule may be applied to the ends of the wire for a secure connection with, for example, a terminal on the outlet, switch, or the like.

The wires from the existing/original outlet can be distributed/connected to the 3PDT switch and can support the respective receptacle/plug (3-, 4- or 5-prong) type and the desired voltage type (either 240 VAC or 480 VAC with 2 or 3 active wires). For example, as shown in FIGS. 1 through 3, a first line wire 28, a second line wire 30 and a neutral wire 26 may be disposed inside the housing 12 to connect each receptacle 14, 16 to each throw side of the switch 18. Each housing 12 can be built to a set configuration of connector and voltage type, e.g., 3-prong receptacles and 240 VAC or 4-prong receptacles and 480 VAC. Different box configurations/models can be pre-built for different receptacles and voltages.

A cable with plug 24 can be provided to ensure the connectors of the existing outlet are correctly connected to the first and second receptacles 14, 16.

Optional safety features can be included, such as arc-fault circuits, ground-fault circuits, or the like.

To use the switch box 10, the operator can connect the cable with plug 24 to an existing 240 VAC or 480 VAC outlet (not shown). The operator may connect two loads to the AC switch box 10 at the first receptacle 14 and the second receptacle 16. The loads can be any 240 VAC or 480 VAC load that is less than the safe limit of the switch and the receptacle, typically about 80% of the current rating. For example, for a 30 A system, this would limit the loads to about 24 A at 250 VAC. Electric dryers and EV chargers are typically within this limit. Either receptacle 14, 16 can be used for the electric dryer or the EV charger, for example.

The switch 18 can determine at what receptacle, the first receptacle 14 or the second receptacle 16 the 240 VAC or 480 VAC is connected. If the first receptacle 14 (side A) is selected, the 240 VAC or 480 VAC is present at the first receptacle 14. If the second receptacle 16 (side B) is selected, the 240 VAC or 480 VAC is present at the second receptacle.

The meter 20 can be designed to have two display modes, where a first display mode may show a user the voltage, current, and power, measurements when the second receptacle 16 is selected. The meter 20 may be OFF when the first receptacle 14 is selected. A second display mode can have the meter 20 always activated to provide voltage, current, and power measurements for the second receptacle 16. The first display mode may consume less power, where the second display mode precludes repeated power-cycling to the AC meter and thus may extend the lifespan of the AC meter. In some embodiments, a meter 20 may be provided for each receptacle, where each meter 20 provides a respective informational display for the first receptacle 14 and the second receptacle 16. The informational display can include voltage, current, power, or the like and may be displayed in a textual or graphical display format, for example.

In some embodiments, an internal temperature may also be shown on the meter 20. In some embodiments a thermistor 21 may be used to measure temperature within the switch box 10. Of course, other temperature measurement techniques may be used to monitor internal temperature.

Typically, the user can make a voltage selection at side A or B, then starts to run the load at either side A or B until done, then changes side when the load is not pulling, i.e., when no current is present. This typical use does not expose the switch 18 to arcing. However, if the user changes/toggles the switch 18 while the load is pulling, i.e., when high current is present, there may be arcing at the switch because the abrupt change in current and any inductance in the wiring and/or in the load/system can generate a large voltage (V−L=L*di/dt). Arc suppression circuits may be used at the switch 18 to minimize such arcing which may damage the switch.

In some embodiments, an automatic version of the switch box 10 may be provided, where the manual AC switch 18 is activated automatically, either via a switch, or through other circuitry, such as power transistors, or the like.

In the automatic system, a microcomputer system can be included to implement the following algorithm:

The on-board microcomputer can continually and accurately monitor the current drawn by the first receptacle 16A, where the electric dryer may be connected to receive power from this receptacle and whenever the dryer is deemed active, i.e., the current is more than a predetermined threshold, e.g., 0.1 ampere for a period of time, the microcomputer can de-activate the second receptacle 18A where the EV charger is connected.

The microcomputer can automatically reconnect power to the second receptacle 18A (EV charger) whenever the first receptacle 16A (electric dryer) is safely inactive, i.e., the monitored current is less than a predetermined threshold, e.g., 0.1 ampere for more than a safe time period. In some embodiments, the microcomputer can include an on-board temperature measurement device that can be used in place of the thermistor 21, described above.

Activation and de-activation of power to the second receptacle 18A can be done by power relays or transistors under microcomputer control.

This default selection is deliberately made to "favor" the first receptacle 16A, where the electric dryer is expected. The reasons for this are because the dryer operation is more urgent, with clothes that need to be dried and typically takes less time (about 1 to 1.5 hours), while EV charging may take >10 hours. The user can give EV charger priority by plugging it to the first receptacle 18A, if desired.

Two LED indicators can be used to indicate which receptacle is on/activated. In some embodiments, the LED indicators may be programmed to provide an indication, such as via periodic flashing, to indicate proper operation of the device.

The optional AC panel meter can be configured to be always on to provide voltage, current, temperature and/or power measurements for the second receptacle 18A (EV charger). In some embodiments, one or more LCD displays may be used to display information for the user.

There may be an optional normally open momentary switch that may be configured to that when the user presses and holds this switch for longer than a specified time, e.g. 3 sec, the microcomputer will de-activate the second receptacle 18A (EV charger, for example) for a set time, e.g., 90 seconds, so that the user can safely remove the charger cable from the EV.

The housing 40 for the automatic AC switch box 50 may be the same or bigger than the standard manual model, AC switch box 10, discussed above.

Figure 4:
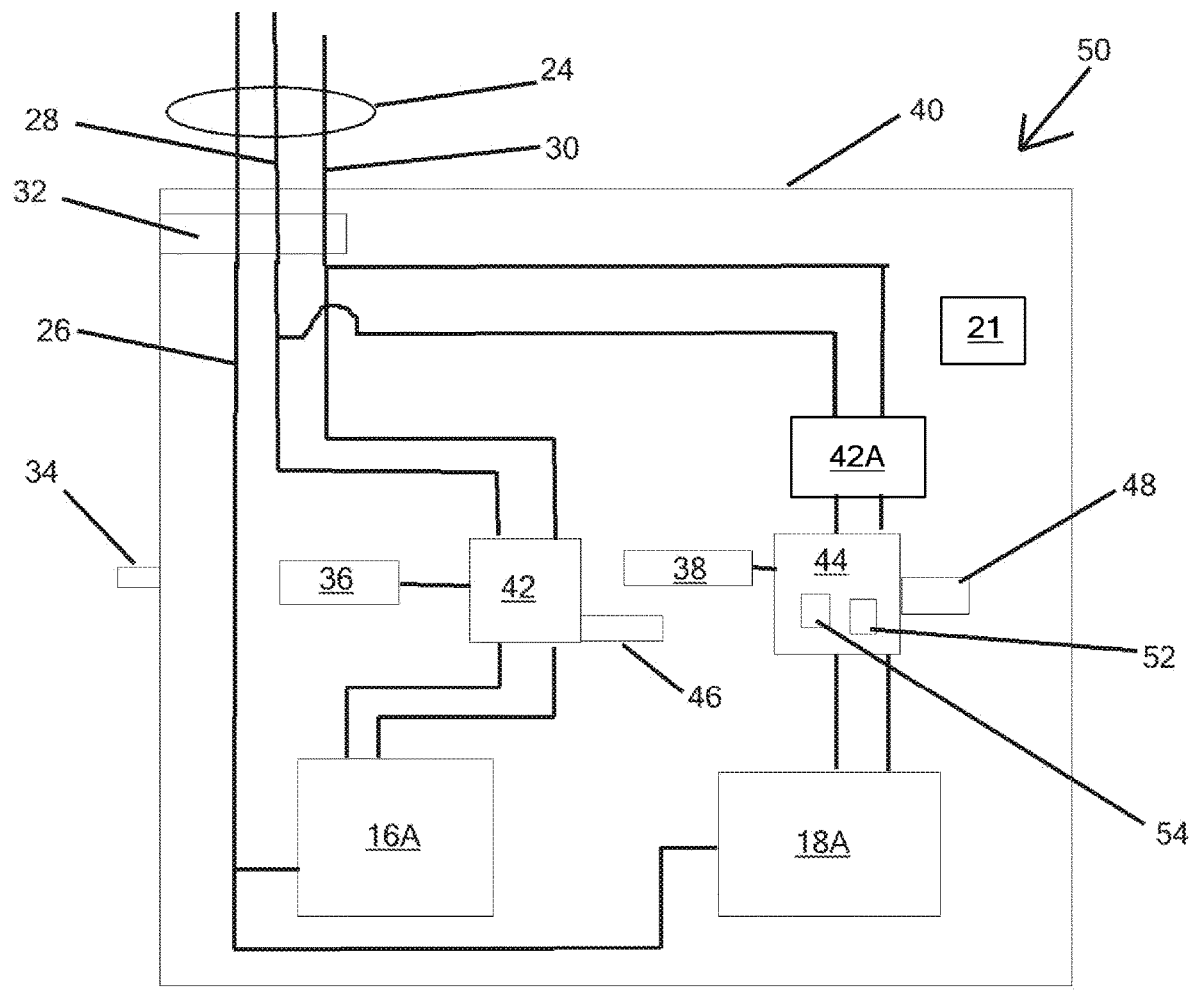
FIG. 4 illustrates a schematic representation of an automatic power switch box according to another exemplary embodiment of the present invention.

Referring to FIG. 4, a schematic representation of an automatic AC switch box 50 is shown. Similar to that of FIGS. 1 through 3, power may be provided through lines 28, 30 and neutral 26. Of course, depending on the configuration, other power, neutral and ground lines may be present. Like that described above, a cord and plug (not shown) may be used to connect the switch box 50 to an existing outlet. A similar fuse 32 and reset button 34 may be present on the housing 40 of the switch box 50. Overcurrent protection may be provided for each receptacle 16A, 18A by overcurrent devices 46, 48. A current monitor 42 may be configured to measure current drawn by the first receptacle 16A. A second current monitor 42A may be configured to measure current drawn by the second receptacle 18A. One or more displays 36, 38 may be provided to display voltage, current, power, temperature or the like at one or both of the receptacles 16A, 18A. The displays 36, 38 can display the data in numerical/textual-based format or in a graphical-based format, for example.

A switch 44 may be used to disconnect power from reaching the second receptacle 18A. The switch 44 may include power relays or transistors 52, 54, as discussed in greater detail below.

The Automatic Version (AV) of the switch box 50 can include power relays or transistors 52, 54, such as MOSFETs, connected in parallel, to switch the EV-charger port, second receptacle 18A, for a 30 A load. This design allows the hardware to fit into the same box/housing as the manual switch box 10, described above.

Figure 5:
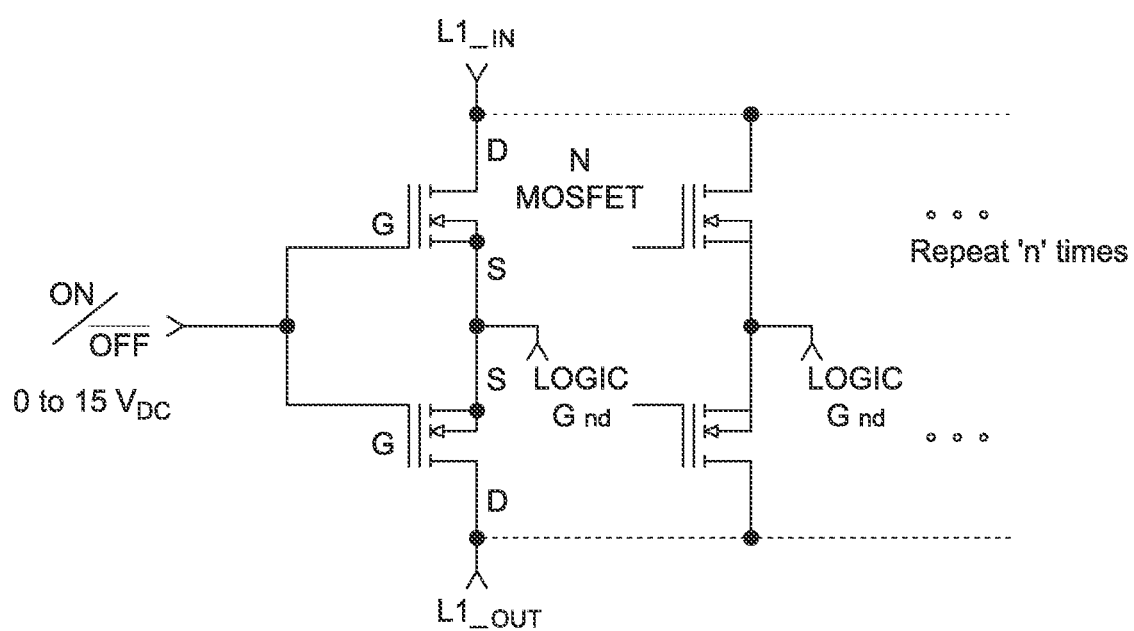
FIG. 5 illustrates a schematic representation of a MOSFET gate driven switching circuit usable with an automatic power switch box according to an exemplary embodiment of the present invention.
Figure 6:
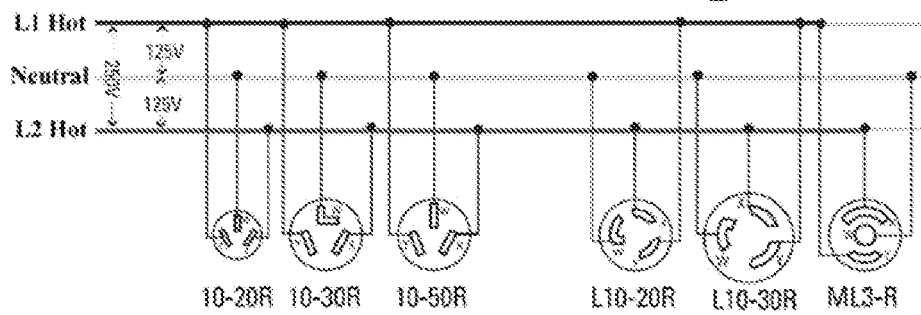
FIG. 6 illustrates a conventional power connection wiring diagram for a three-pole, three-wire 240/250 VAC outlet.
Figure 7:
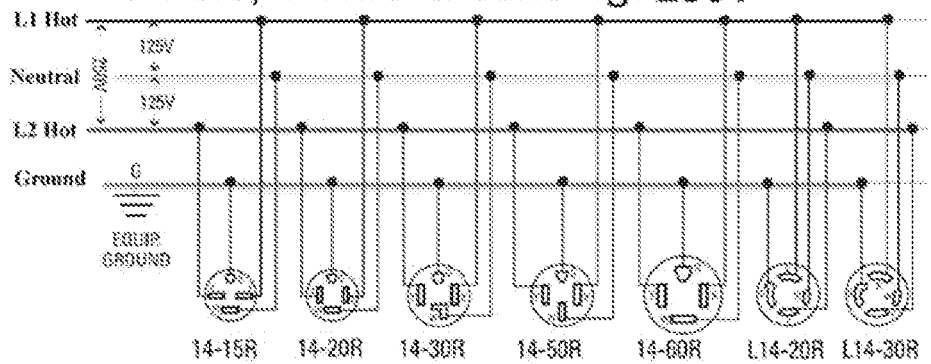
FIG. 7 illustrates a conventional power connection wiring diagram for a three-pole, four-wire 240/250 VAC outlet.
Figure 8:
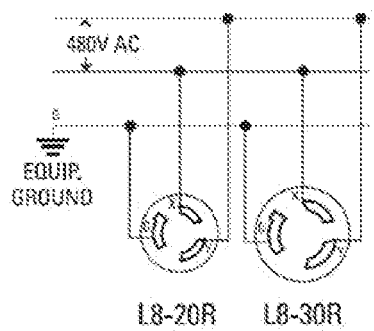
FIG. 8 illustrates a conventional power connection wiring diagram for a two-pole, three-wire single phase 480 VAC outlet.
Figure 9:
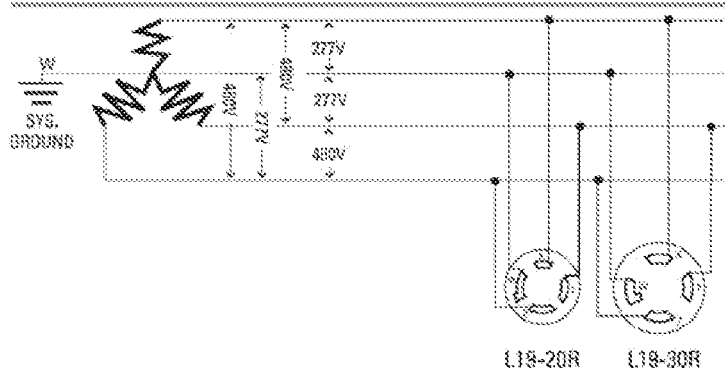
FIG. 9 illustrates a conventional power connection wiring diagram for a four-pole, four-wire three phase 277/480 VAC outlet.
Figure 10:
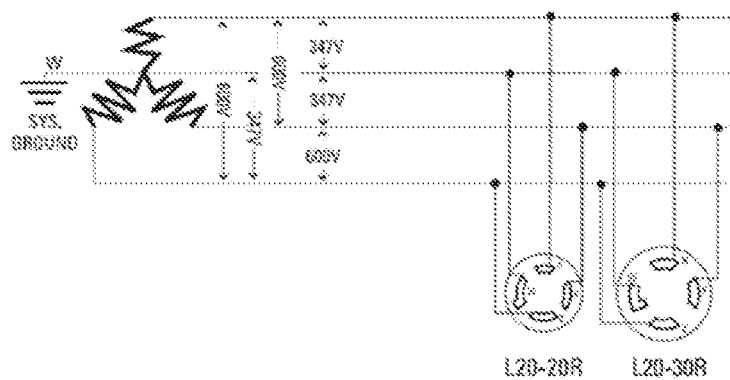
FIG. 10 illustrates a conventional power connection wiring diagram for a four-pole, four-wire three phase 347/600 VAC outlet.
Figure 11:
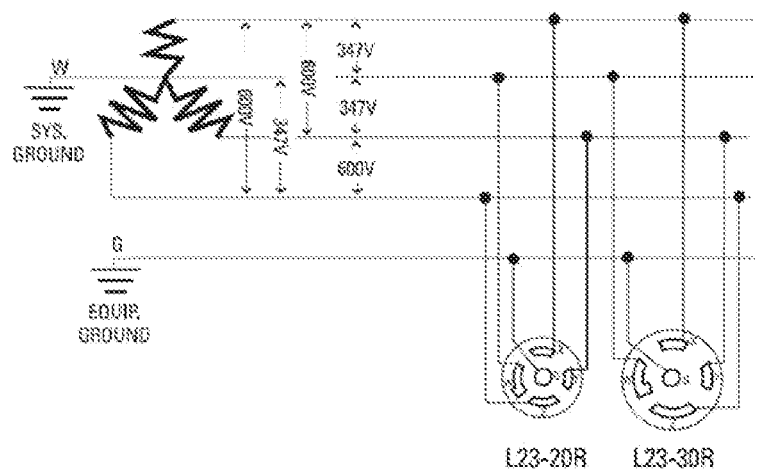
FIG. 11 illustrates a conventional power connection wiring diagram for a four-pole, five-wire three phase 347/600 VAC outlet.

The MOSFET power transistor switch is shown in the schematic diagram of FIG. 5. Two N-channel MOSFETs were connected in series at the source (S) terminal. When the gate (G) is set HI (from about 3 V DC up to about 15 V DC), the switch is closed and AC current can pass. When the gate (G) is set LO (about 0 V DC), the switch is open and AC current cannot pass. Up to 12 such parallel MOSFET-pairs, for example, can be used in the automatic version of the AC switch box to switch one active AC line (L1 or L2) and handle the generated heat. By using parallel MOSFETs, the power per MOSFET transistor can be lowered. In some embodiments, the switch box may allow breaking both L1 and L2 lines while keeping the same form factor/housing.

Because the MOSFETs are small and flat, this power transistor design approach enables the fitting of the automatic version AC switch hardware in a smaller/thinner or the smallest/thinnest box. Conversely, a design without power transistors will require a larger/thicker box/housing.

The Automatic Version (AV) of the switch box 50 can include one or two mini LCD displays, similar to the displays described above, that are used to display current or/and voltage at one or both receptacles from built-in and proprietary circuitries with various specifications, such as ±1 to ±2% accuracy for current measurements, ±1% to ±2% accuracy for voltage measurements.

The current monitor 42 may be done by a current transformer (CT) circuit. One primary task in the automatic switch box 50 is to accurately measure/monitor AC current at the dryer side, receptacle 16A. This may be achieved by the design at current levels from about 0.1-0.2 A to at least 3 A or up to 4 A. Typical response time for this measurement can be within 10 to 20 milliseconds, as with a 30 A fuse and about a 25 A EV load at the second receptacle 18A, the hardware needs to know when the first receptacle 16A gets to about 5 A or less as soon as possible to dis-engage second receptacle 18A.

The current transformer and its associated operational amplifier circuit can be used to obtain a voltage that linearly relates to the magnetic field generated by an AC current and therefore to the AC current itself. This voltage can then be converted into a digital format by an Analog-to-Digital Converter (ADC) with sufficient resolution and accuracy to yield +/−1% to +/−2% current measurements. The ADC can be physically inside the microcomputer within the housing of the power switch.

The microcomputer can continually make the current measurements at the favored outlet and, depending on the detected current load, the microcomputer can automatically perform the switching to connect or remove AC power at the non-favored outlet.

Software techniques can be used to sample and filter the measurement data to preclude false readings.

The Automatic AC Switch Box can include two current monitor circuits and is thus capable of monitoring and reporting AC currents at both receptacles independently. Optionally, it can also monitor the system AC input voltage (240 VAC).

Other current monitoring technologies may be used within the scope of the present invention. For example, in some embodiments, a Hall Effect (HE) sensor can be used to monitor/measure AC and DC currents. The Hall Effect monitor can measure both AC and DC currents. In other embodiments, a shunt/series resistor can also be used to measure current. Each of these technologies, or other known methods, may be used to measure current drawn by at least one of the first and second receptacles.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. An alternating current (AC) switch device comprising:
   a cord and plug configured to electrically connect to an existing outlet;
   a housing containing a first receptacle and a second receptacle; and
   a switch configured to deliver power from the cord and plug to one of the first receptacle and the second receptacle, wherein:
   the switch is an automatic switch; and
   power transistors are used to turn/switch off power to the second receptacle.

2. The AC switch device of claim 1, wherein the first receptacle and the second receptacle are rated at an amperage of at least 30 amperes.

3. The AC switch device of claim 1, further comprising at least one meter operable to display at least one of voltage, current, temperature and power of at least one of the first receptacle and the second receptacle.

4. The AC switch device of claim 3, further comprising at least one fuse protecting the at least one meter.

5. The AC switch device of claim 4, wherein the at least one fuse is accessible through a cover provided on the housing.

6. The AC switch device of claim 1, wherein the switch is a manually operated switch.

7. The AC switch device of claim 6, wherein the switch is a three-pole, double throw (3PDT) switch for applications requiring switching of three legs or a two-pole, double throw (2PDT) switch for applications requiring switching of two legs.

8. The AC switch device of claim 1, wherein the first receptacle and the second receptacle are configured for at least 240 volts AC.

9. The AC switch device of claim 1, further comprising a microcomputer system used to control the automatic switch.

10. The AC switch device of claim 1, wherein both the first receptacle and the second receptacle are configured to draw power from the cord and plug.

11. The AC switch device of claim 1, further comprising at least one current monitor operable to monitor current drawn by at least one of the first receptacle and the second receptacle.

12. The AC switch device of claim 11, wherein power is turned off to the second receptacle when the current drawn by the first receptacle exceeds a predetermined maximum as detected by the current monitor.

13. The AC switch device of claim 12, wherein power is returned to the second receptacle when the current drawn by the first receptacle is below a predetermined minimum.

14. The AC switch device of claim 1, further comprising at least one temperature sensor operable to monitor a temperature inside the AC switch device.

15. The AC switch device of claim 14, wherein the temperature sensor is operable to shut down at least one of the first receptacle or the second receptacle when the temperature exceeds a predetermined maximum.

16. The AC switch device of claim 15, wherein power is reconnected to the first receptacle or the second receptacle after a predetermined period of time in a shut down mode.

17. The AC switch device of claim 1, further comprising at least one lamp, the at least one lamp providing illumination to indicate which one of the first receptacle and the second receptacle is energized.

18. The AC switch device of claim 17, wherein the LED provides a periodic flashing to indicate proper operation of the AC switch device.

19. The AC switch device of claim 1, further comprising internal wiring having an end encased in a ferrule prior to its connection to a component of the AC switch device.

\* \* \* \* \*